(12) United States Patent
Suetsugu et al.

(10) Patent No.: US 6,541,838 B1
(45) Date of Patent: Apr. 1, 2003

(54) POWER MODULE

(75) Inventors: Eiji Suetsugu, Tokyo (JP); Masakazu Fukada, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/705,770

(22) Filed: Nov. 6, 2000

(30) Foreign Application Priority Data

May 31, 2000 (JP) ........................................ 2000-161599

(51) Int. Cl.$^7$ .............................................. H01L 29/00
(52) U.S. Cl. ....................... 257/500; 257/784; 257/691; 257/723; 257/724; 361/18; 361/100
(58) Field of Search ................................ 257/500, 784, 257/691, 723, 724; 361/18, 100

(56) References Cited

U.S. PATENT DOCUMENTS

| | | |
|---|---|---|
| 4,458,305 A | 7/1984 | Buckle et al. |
| 5,025,360 A | 6/1991 | Latos |
| 5,459,356 A | 10/1995 | Schulze et al. |
| 5,608,595 A * | 3/1997 | Gourab et al. ............... 361/79 |
| 6,236,110 B1 * | 5/2001 | Muto et al. ................. 257/724 |
| 6,249,024 B1 * | 6/2001 | Mangtani ..................... 257/341 |

FOREIGN PATENT DOCUMENTS

EP 0 578 108 A1 1/1994

* cited by examiner

Primary Examiner—Steven Loke
Assistant Examiner—Nitin Parekh
(74) Attorney, Agent, or Firm—Oblon, Spivak, McClelland, Maier & Neustadt, P.C.

(57) ABSTRACT

Provided is a power module capable of driving an SR motor, giving a small size and high versatility and reducing a manufacturing cost. A switching element 1a and a diode element 2b which are to be connected to a P power wiring 5 are provided to form a first line on the band-shaped P power wiring 5, a switching element 1b and a diode element 2a which are to be connected to an N power wiring 6 are provided to form a second line aligned with the first line, and first band-shaped portions 41 and 44 of output terminals 3 and 4 and a band-shaped portion 61 of the N power wiring 6 are provided therebetween. The first band-shaped portions 41 and 44 and the band-shaped portion 61 have a two-layer structure with an insulating layer interposed therebetween. The switching elements 1a and 1b and the diode elements 2a and 2b are arranged alternately.

20 Claims, 5 Drawing Sheets

POWER MODULE

BACKGROUND OF THE INVENTION

1. Field of the Invention

The present invention relates to a power module suitable for driving a switched reluctance motor (which will be hereinafter referred to as an "SR" motor).

2. Description of the Background Art

FIG. 10 is a circuit diagram showing a circuit structure of a conventional power module for driving an induction motor, a DC motor or the like. In the power module, three series circuits are connected in parallel with one another between a P power wiring 85 for transmitting a high potential side power potential and an N power wiring 86 for transmitting a low potential side power potential, each of the series circuits having two switching elements 81 connected in series. For example, an IGBT is used for the switching element 81.

Each series circuit is further provided with a diode element 82 connected to each switching element 81 in antiparallel. The "antiparallel connection" implies such a parallel connection that a direction of a main current flowing in the switching element 81 is reverse to that of a forward current flowing in the diode element 82. Consequently, the diode element 82 functions as a flywheel diode for preventing the switching element 81 from being damaged by a backward current.

An output terminal 83, 84 or 85 is connected to a connecting portion of the two switching elements 81 belonging to the series circuit. Six switching elements 81 are selectively turned on and off out of phase so that outputs having three phases, that is, U, V and W phases are fetched from the output terminals 83, 84 and 85, respectively. Accordingly, the induction motor or the like can be driven through a connection of the output terminals 83, 84 and 85 to three-phase inputs of the induction motor or the like, respectively.

In recent years, the SR motor different from a conventional induction motor or DC motor has appeared. However, a special connecting system for driving the SR motor is required and the power module shown in FIG. 10 cannot be used. For this reason, each of a switching element and a diode element as discrete elements or a combination of conventional power modules has been employed as a driving device for driving the SR motor. As a result, there has been a problem in that the driving device is large-sized and is lacking in versatility and a manufacturing cost is increased. Consequently, the spread of the SR motor is obstructed.

SUMMARY OF THE INVENTION

In order to eliminate the above-mentioned problems of the conventional art, it is an object of the present invention to provide a power module capable of driving the SR motor, giving a small size and high versatility and reducing the manufacturing cost.

A first aspect of the present invention is directed to a power module comprising a substrate, first and second power wirings provided over the substrate, first to Nth ($N \geq 2$) terminal pairs provided on the substrate, each pair thereof having first and second output terminals, and first to Nth circuits provided over the substrate, each circuit thereof being connected to the first and second power wirings, the nth circuit including, for all n (n=1 to N), a first series circuit having a first switching element connected to the first power wiring and a first diode element connected to the second power wiring which are connected in antiseries, a connecting portion thereof being connected to the first output terminal of the nth terminal pair, and a second series circuit having a second diode element connected to the first power wiring and a second switching element connected to the second power wiring which are connected in antiseries, a connecting portion thereof being connected to the second output terminal of the nth terminal pair, wherein the first to Nth circuits are arranged in this order, all of switching elements and diode elements connected to the first power wiring are arranged to form a first line, all of switching elements and diode elements connected to the second power wiring are arranged to form a second line aligned with the first line, the switching elements and the diode elements are arranged alternately in all of directions along the first line, along the second line and crossing the first and second lines, at least a portion of the first output terminal and at least a portion of the second output terminal are arranged between the first line and the second line for each of the first to Nth terminal pairs, and for the all n, the first switching element and the first diode element which belong to the nth circuit are connected through a first bonding wire, a middle portion of the first bonding wire being connected to the at least a portion of the first output terminal belonging to the nth terminal pair, and the second switching element and the second diode element which belong to the nth circuit are connected through a second bonding wire, a middle portion of the second bonding wire being connected to the at least a portion of the second output terminal belonging to the nth terminal pair.

A second aspect of the present invention is directed to a power module comprising a substrate, first and second power wirings provided over the substrate, first to Nth ($N \geq 2$) terminal pairs provided over the substrate, each pair thereof having first and second output terminals, and first to Nth circuits provided over the substrate, each circuit thereof being connected to the first and second power wirings, the nth circuit including, for all n (n=1 to N), a first series circuit having a first switching element connected to the first power wiring and a first diode element connected to the second power wiring which are connected in antiseries, a connecting portion thereof being connected to the first output terminal of the nth terminal pair, and a second series circuit having a second diode element connected to the first power wiring and a second switching element connected to the second power wiring which are connected in antiseries, a connecting portion thereof being connected to the second output terminal of the nth terminal pair, wherein the first to Nth circuits are arranged in this order, all of switching elements and diode elements connected to the first power wiring are arranged to form a first line, all of switching elements and diode elements connected to the second power wiring are arranged to form a second line aligned with the first line, the switching elements and the diode elements are arranged alternately in all of directions along the first line, along the second line and crossing the first and second lines, at least a portion of the first output terminal and at least a portion of the second output terminal are arranged like a band extended along the first line and the second line therebetween for each of the first to Nth terminal pairs, the second power wiring has a band-shaped portion extended along the first and second lines therebetween, and the band-shaped portion is arranged in parallel with the at least a portion of all of the first and second output terminals.

A third aspect of the present invention is directed to a power module comprising a substrate, first and second power wirings provided over the substrate, first to Nth (N≧2) terminal pairs provided over the substrate, each pair thereof having first and second output terminals, and first to Nth circuits provided over the substrate, each circuit thereof being connected to the first and second power wirings, the nth circuit including, for all n (n=1 to N), a first series circuit having a first switching element connected to the first power wiring and a first diode element connected to the second power wiring which are connected in antiseries, a connecting portion thereof being connected to the first output terminal of the nth terminal pair, and a second series circuit having a second diode element connected to the first power wiring and a second switching element connected to the second power wiring which are connected in antiseries, a connecting portion thereof being connected to the second output terminal of the nth terminal pair, wherein the first to Nth circuits are arranged in this order, all of switching elements and diode elements connected to the first power wiring are arranged to form a first line, all of switching elements and diode elements connected to the second power wiring are arranged to form a second line aligned with the first line, the switching elements and the diode elements are arranged alternately in all of directions along the first line, along the second line and crossing the first and second lines, at least a portion of the first output terminal and at least a portion of the second output terminal are arranged like a band extended along the first line and the second line therebetween for each of the first to Nth terminal pairs, the second power wiring has a band-shaped portion extended along the first and second lines therebetween, and the band-shaped portion and the at least a portion of all the first and second output terminals are separately provided on one of main surfaces of a band-shaped insulating layer and the other of the main surfaces, and thereby being opposite to each other in parallel with the insulating layer interposed therebetween.

A fourth aspect of the present invention is directed to the power module according to the second or third aspect of the present invention, wherein the second power wiring has N protrusions protruded from the band-shaped portion to enter the second line, each of the N protrusions being provided between the first diode element and the second switching element which belong to the same circuit and being connected to a middle portion of a bonding wire connecting the first diode element and the second switching element.

A fifth aspect of the present invention is directed to the power module according to any of the first to fourth aspects of the present invention, wherein the first power wiring is provided like a band along the first line, and the first switching element and the second diode element which belong to each of the first to Nth circuits are provided on the first power wiring.

A sixth aspect of the present invention is directed to the power module according to any of the first to fifth aspects of the present invention, further comprising a case for housing the first to Nth circuits provided over the substrate cooperating with the substrate, each of the first and second output terminals of each of the first to Nth terminal pairs having a protrusion which is different from the at least a portion and protruded outward from the case, and all of the protrusions belonging to the first to Nth terminal pairs being provided closer in the same terminal pair than between different terminal pairs.

A seventh aspect of the present invention is directed to the power module according to the sixth aspect of the present invention, wherein each of the first and second output terminals belonging to each of the first to Nth terminal pairs has first and second band-shaped portions having one ends crossing at a right angle to take an L-shaped planar outline, the first band-shaped portion being provided in parallel with the first and second lines corresponding to the at least a portion and an end of the second band-shaped portion corresponding to the protrusion, and the second band-shaped portions of the first and second output terminals belonging to each of the first to Nth terminal pairs are arranged in parallel such that both of the first and second output terminals take an almost T-shaped planar outline.

An eighth aspect of the present invention is directed to the power module according to the seventh aspect of the present invention, wherein the second band-shaped portions of the first and second output terminals belonging to each of the first to Nth terminal pairs are electrically connected through a bonding wire.

A ninth aspect of the present invention is directed to the power module according to the seventh aspect of the present invention, wherein the protrusions of the first and second output terminals belonging to each of the first to Nth terminal pairs are electrically connected through a conductive connecting member.

A tenth aspect of the present invention is directed to the power module according to the seventh aspect of the present invention, wherein the second band-shaped portions of the first and second output terminals belonging to each of the first to Nth terminal pairs are connected integrally with each other such that both of the first and second output terminals take a T-shaped planar outline.

According to the first aspect of the present invention, the elements to be connected to the first power wiring are provided along the first line, the elements to be connected to the second power wiring are provided along the second line aligned with the first line, and at least portions of respective output terminals are provided therebetween. Therefore, the size of the module can be reduced. In addition, the switching elements and the diode elements are provided alternately. Consequently, mutual heat interference of the switching elements, which generate large heat, can be reduced. Furthermore, the bonding wire connecting the element provided on the first line and the element provided on the second line is relayed by at least a portion of the output terminal positioned therebetween. Therefore, wire bonding can be carried out continuously in a manufacturing process and a manufacturing efficiency can be enhanced.

According to the second aspect of the present invention, the elements to be connected to the first power wiring are provided along the first line, the elements to be connected to the second power wiring are provided along the second line aligned with the first line, and at least portions of respective output terminals are provided therebetween. Therefore, the size of the module can be reduced. In addition, the switching elements and the diode elements are provided alternately. Consequently, mutual heat interference of the switching elements, which generate large heat, can be reduced. Furthermore, the band-shaped portion of the second power wiring and at least portions of respective output terminals are arranged in parallel with each other between the first and second lines. Therefore, it is possible to reduce an inductance generated on a current path.

According to the third aspect of the present invention, the elements to be connected to the first power wiring are provided along the first line, the elements to be connected to the second power wiring are provided along the second line aligned with the first line, and at least portions of respective output terminals are provided therebetween. Therefore, the size of the module can be reduced. In addition, the switching elements and the diode elements are provided alternately. Consequently, mutual heat interference of the switching elements, which generate large heat, can be reduced. Furthermore, the band-shaped portion of the second power wiring and at least portions of respective output terminals are provided opposite to each other between the first and second lines with the insulating layer interposed therebetween. Therefore, it is possible to reduce an inductance generated on a current path. In addition, it is possible to decrease the area of the substrate and to further reduce the size of the module.

According to the fourth aspect of the present invention, the second power wiring has the protrusions, and the bonding wire connecting the first diode element and the second switching element which belong to the same circuit is relayed by the protrusion positioned therebetween. Therefore, wire bonding can be carried out continuously in a manufacturing process and a manufacturing efficiency can be enhanced.

According to the fifth aspect of the present invention, the first power wiring is provided like a band along the first line and the elements to be arranged along the first line is provided on the first power wiring. Therefore, the shortest current path is formed between the first power line and each element and an inductance generated on the current path can further be reduced.

According to the sixth aspect of the present invention, portions of respective output terminals are protruded outward from the case, and the protrusions are provided apart between different circuits and close in the same circuit. Therefore, a set of output terminals belonging to the same circuit can easily be connected on the outside. Consequently, the power module can be used for driving an induction motor, a DC motor or the like. In other words, it is possible to implement a power module having high versatility which is not restricted to the use for driving an SR motor.

According to the seventh aspect of the present invention, all the first and second output terminals are L-shaped and the first and second output terminals belonging to the same circuit are provided to take an almost T-shaped planar outline. Therefore, an inductance generated on a current path can further be reduced. Moreover, since the shapes of all the output terminals are L-shaped, all the output terminals can be manufactured by using a single metal mold and a manufacturing cost can be reduced.

According to the eighth aspect of the present invention, the second band-shaped portions of the first and second output terminals belonging to the same circuit are electrically connected through the bonding wire. Therefore, the power module can be used for driving an induction motor, a DC motor or the like. Moreover, the power module is used for driving an SR motor as it is, except for the bonding wire. Consequently, a manufacturing cost can be reduced.

According to the ninth aspect of the present invention, the protrusions of the first and second output terminals belonging to the same circuit are electrically connected to each other through the conductive connecting member. Therefore, the power module can be used for driving an induction motor, a DC motor or the like. Moreover, the power module is used for driving an SR motor as it is, except for the connecting member. Consequently, a manufacturing cost can be reduced. Furthermore, since the connecting member is applied on the outside of the case, a user can manually carry out remodeling easily.

According to the tenth aspect of the present invention, both of the first and second output terminals belonging to the same circuit are connected integrally to take a T-shaped planar outline. Therefore, the power module can be used for driving an induction motor, a DC motor or the like. Moreover, the power module is used for driving an SR motor as it is, except for the output terminal. Consequently, a manufacturing cost can be reduced.

These and other objects, features, aspects and advantages of the present invention will become more apparent from the following detailed description of the present invention when taken in conjunction with the accompanying drawings.

DESCRIPTION OF THE PREFERRED EMBODIMENTS

[1. First Embodiment]

Figure 1:
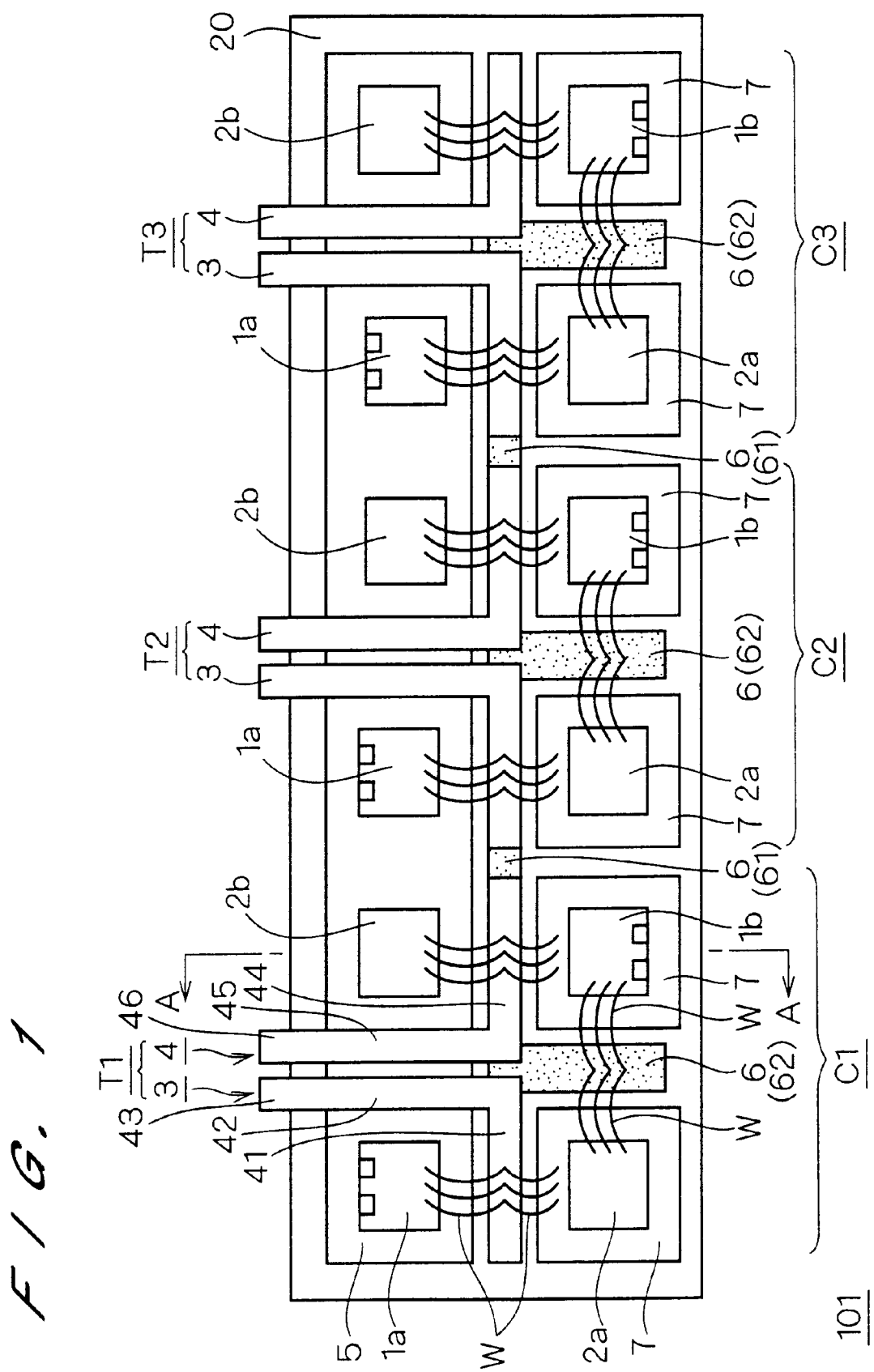
FIG. 1 is a plan view showing a power module according to a first embodiment.

FIG. 1 is a plan view showing a power module according to a first embodiment.

Figure 2:
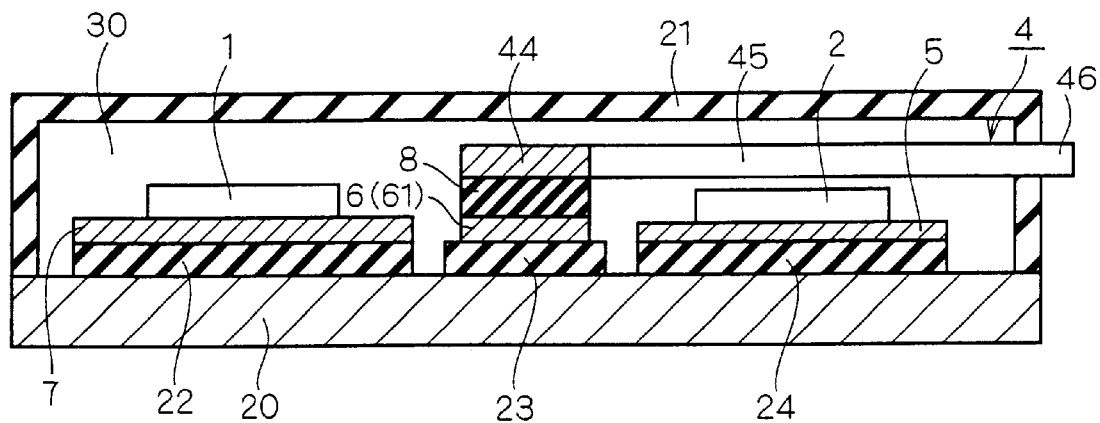
FIG. 2 is a sectional view showing the power module taken along the line A—A in FIG. 1.
Figure 3:
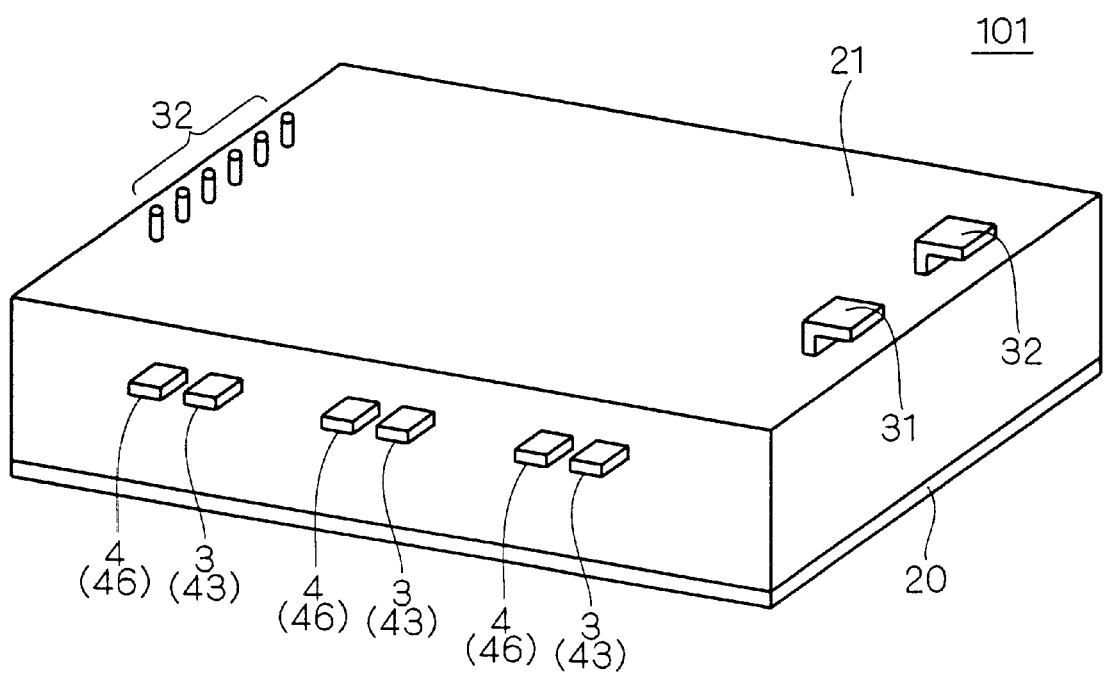
FIG. 3 is a perspective view showing the appearance of the power module illustrated in FIG. 1.
Figure 4:
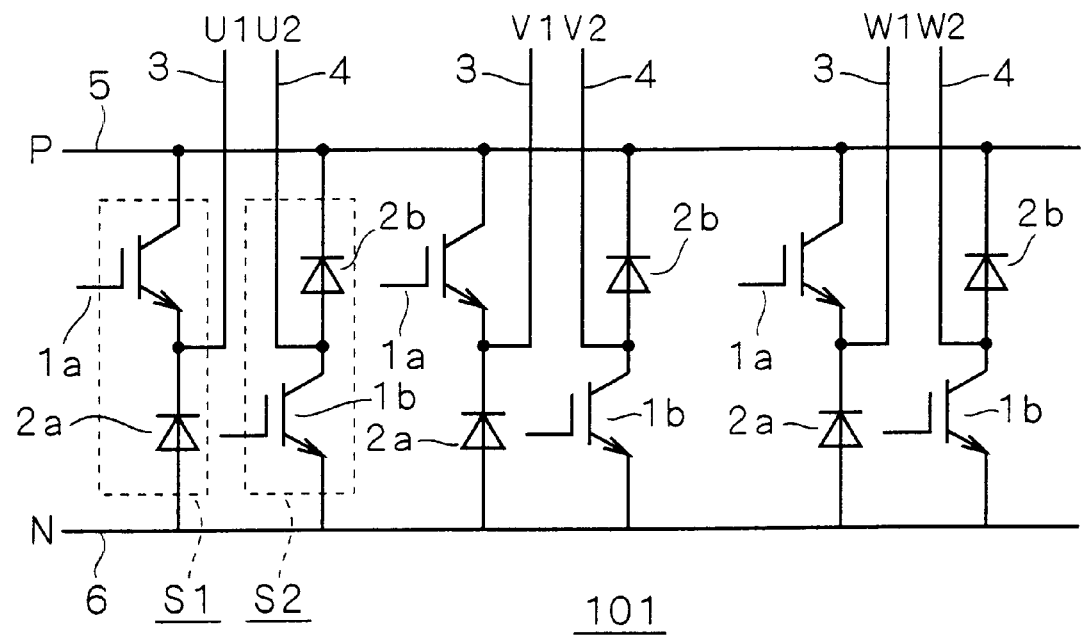
FIG. 4 is a circuit diagram showing the power module illustrated in FIG. 1.

FIG. 2 is a sectional view taken along the line A—A in FIG. 1. Furthermore, FIG. 3 is a perspective view showing the appearance of the power module illustrated in FIG. 1. Moreover, FIG. 4 is a circuit diagram showing the power module illustrated in FIG. 1. The power module according to the first embodiment will be described below with reference to these drawings.

[1.1. Structure of Circuit]

In a power module 101 according to the first embodiment, three circuits C1 to C3 are connected to a P power wiring 5 for transmitting a high potential side power potential and an N power wiring 6 for transmitting a low potential side power potential. In other words, the circuits C1 to C3 are connected in parallel with one another between the P power wiring 5 and the N power wiring 6. Each of the circuits C1 to C3 includes a series circuit S1 having a switching element 1a a and a diode element 2a which are connected to each other in antiseries and a series circuit S2 having a switching element 1b and a diode element 2b which are connected to each other in antiseries.

The "antiseries connection" implies such a series connection that a direction of a main current flowing in the switching element is reverse to that of a forward current flowing in the diode element. Consequently, the diode elements 2a and 2b function as flywheel diodes for preventing the switching elements 1a and 1b from being damaged by a backward current.

The switching elements 1*a* and 1*b* have structures identical to each other and the diode elements 2*a* and 2*b* have structures identical to each other. While the switching elements 1*a* and 1*b* are power IGBTs as shown in FIG. 4 in the present embodiment, the present invention is not restricted to this example.

A first main electrode (a collector of the IGBT) of the switching element 1*a* and a cathode electrode of the diode element 2*b* are connected to the P power wiring 5, and a second main electrode (an emitter of the IGBT) of the switching element 1*b* and an anode electrode of the diode element 2*a* are connected to the N power wiring 6. Moreover, a second main electrode of the switching element 1*a* is connected to an output terminal 3 together with a cathode electrode of the diode element 2*a*. Similarly, a first main electrode of the switching element 1*b* is connected to an output terminal 4 together with an anode electrode of the diode element 2*b*. Terminal pairs T1 to T3 are individually connected to the circuits C1 to C3, each of them including a set of output terminals 3 and 4.

Six switching elements 1*a* and 1*b* are selectively turned on and off out of phase so that outputs having three phases, that is, U, V and W phases are fetched from the terminal pairs T1 to T3, respectively. Accordingly, a set of output terminals 3 and 4 belonging to the terminal pairs T1 to T3 are connected to three-phase inputs of an SR motor, respectively. Consequently, the SR motor can be driven.

[1.2. Arrangement of Element, Wiring and Terminal]

In the power module 101, various wirings, elements and terminals are provided on a base plate 20 functioning as a substrate and are housed by a case 21 and the base plate 20. A copper plate having an excellent heat radiation characteristic is used for the base plate 20, for example. The circuits C1 to C3 are arranged in this order along one of sides of the base plate 20 having a rectangular planar outline.

The P power wiring 5 is provided like a band on a band-shaped insulating layer 24. The insulating layer 24 and the P power wiring 5 are formed as a ceramic board having a metallic foil formed on a main surface thereof and bonded to an upper surface of the base plate 20, for example. All the switching elements 1*a* and diode elements 2*b* belonging to the circuits C1 to C3 are fixed onto the P power wiring 5 to form a first line and are thus connected electrically to the P power wiring 5. Consequently, the shortest current path is formed between the P power wiring 5 and the elements 1*a* and 2*b* connected to the P power wiring 5. Thus, an inductance generated on the current path can be reduced. This also contributes to a reduction in the size of the power module 101.

Six insulating layers 22 are further arranged on the base plate 20 at an interval from the insulating layer 24 in parallel with the insulating layer 24, and a conductor layer 7 is formed on each of the insulating layers 22. The insulating layer 22 and the conductor layer 7 are formed as a ceramic board having a metallic foil formed along a main surface thereof and bonded to the upper surface of the base plate 20, for example. All the switching elements 1*b* and diode elements 2*a* belonging to the circuits C1 to C3 are fixed onto the conductor layer 7 and are connected electrically. Consequently, all the switching elements 1*b* and diode elements 2*a* are arranged to form a second line in parallel with the first line. All the switching elements 1*a* and 1*b* and all the diode elements 2*a* and 2*b* are used in a bare chip.

In all of directions along the first line, along the second line and crossing the first and second lines, the switching elements 1*a* and 1*b* and the diode elements 2*a* and 2*b* are arranged alternately. Consequently, the six switching elements 1*a* and 1*b* having great heat generation are located farthest and uniformly apart from each other. As a result, a heat interference among all the switching elements 1*a* and 1*b* is reduced so that a local rise in a temperature can be relieved. This also contributes to a reduction in the size of the power module 101.

The N power wiring 6 is formed on an insulating layer 23 provided on the base plate 20. The insulating layer 23 and the N power wiring 6 are formed as a ceramic board having a metallic foil formed along a main surface thereof and bonded to the upper surface of the base plate 20, for example. The N power wiring 6 has a band-shaped portion 61 extended between the first and second lines and in parallel thereto, and has three protrusions 62 protruded from the band-shaped portion 61 to enter the second line. Each of the three protrusions 62 is provided between the diode element 2*a* and the switching element 1*b* which belong to the same circuit (the same one of the circuits C1 to C3, the same applies thereinafter). The diode element 2*a* and the switching element 1*b* which belong to the same circuit are connected to one of ends of a bonding wire W which has a middle portion connected to the protrusion 62 interposed therebetween and the other end thereof, respectively. In a manufacturing process, therefore, wire bonding can be carried out continuously thereamong. Consequently, a manufacturing efficiency can be enhanced.

Both of the output terminals 3 and 4 are formed like plates having L-shaped planar outlines. In other words, the output terminal 3 has a first band-shaped portion 41 and a second band-shaped portion 42 which have ends crossing at a right angle. Similarly, the output terminal 4 has a first band-shaped portion 44 and a second band-shaped portion 45 which have ends crossing at a right angle. In the output terminals 3 and 4 belonging to the same circuit, the second band-shaped portions 42 and 45 are arranged in parallel in proximity to each other. Consequently, both of the output terminals 3 and 4 belonging to the same circuit have an almost T-shaped planar outline. Therefore, an inductance generated on the output terminals 3 and 4 can further be reduced. Moreover, since the shapes of all the output terminals 3 and 4 have the same L shape, they can be manufactured by using a single metal mold. Thus, the manufacturing cost can be reduced.

The second band-shaped portions 42 and 45 penetrate through the case 21 and protrusions 43 and 46 being ends thereof are protruded outward from the case 21. The protrusions 43 and 46 are provided in proximity to each other in the same terminal pair (the same one of the terminal pairs T1 to T3, the same applies thereinafter) and apart from each other between the different terminal pairs. Therefore, a set of protrusions 43 and 46 belonging to the same terminal pair can easily be connected with each other on the outside. Consequently, the structure of the circuit of the power module 101 can be modified identical to that of the circuit shown in FIG. 10. In other words, the power module 101 can be changed over to the use for driving an induction motor, a DC motor or the like. Thus, the power module 101 is constituted as a power module having high versatility which is not restricted to the use for driving the SR motor.

Figure 5:
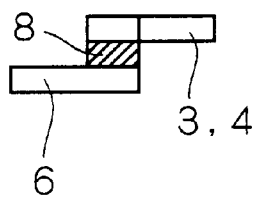
FIG. 5 is a partial sectional view showing the power module illustrated in FIG. 1.

The first band-shaped portions 41 and 44 are provided between the first and second lines in parallel therewith. This also contributes to a reduction in the size of the power module 101. Furthermore, the first band-shaped portions 41 and 44 are provided opposite to and in parallel with the band-shaped portion 61 on the insulating layer 8 formed like a band on the band-shaped portion 61 of the N power wiring 6. These three-dimensional structures are also shown in a partial sectional view of FIG. 5. With the two-layer structure, the inductance generated on the current path can further be reduced. In addition, the area of the base plate 20 can further be decreased and the size of the power module 101 can further be reduced.

In each of the circuits C1 to C3, the switching element 1a and the diode element 2a are connected through the bonding wire W, and furthermore, a middle portion thereof is connected to the first band-shaped portion 41 of the output terminal 3. Similarly, the switching element 1b and the diode element 2b are connected through the bonding wire W, and furthermore, a middle portion thereof is connected to the first band-shaped portion 44 of the output terminal 4. In the manufacturing process, therefore, the wire bonding can be carried out continuously thereamong. Consequently, a manufacturing efficiency can be enhanced.

While the bonding wire W is indirectly connected to the diode element 2a and the switching element 1b through the conductor layer 7 in the example shown in FIG. 1, it may be connected directly to the diode element 2a and the switching element 1b. In any case, the bonding wire W is connected to the diode element 2a and the switching element 1b.

As shown in FIG. 2, preferably, an insulating sealing material 30 such as a gel is filled in an inner portion surrounded by the case 21 and the base plate 20. Moreover, power terminals 31 and 32 are connected to the P power wiring 5 and the N power wiring 6 respectively, and ends thereof are protruded outward from the case 21 (FIG. 3). Similarly, the six control terminals 32 are individually connected to the control electrodes (the gate electrode of the IGBT) of the six switching elements 1a and 1b and ends thereof are exposed and protruded outward from the case 21. An external DC power supply is connected to the power terminals 31 and 32, an external control circuit is connected to the control terminal 32, and furthermore, a load is connected to the protrusions 43 and 46 of the three pairs of output terminals 3 and 4. Thus, the power module 101 can be used.

[2. Second Embodiment]

Figure 6:
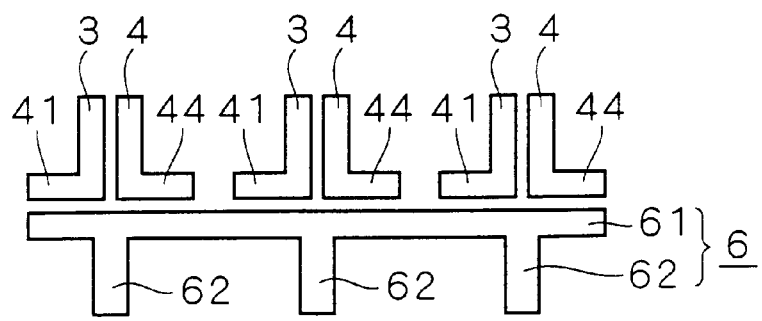
FIG. 6 is a partial plan view showing a power module according to a second embodiment.

First band-shaped portions 41 and 44 of output terminals 3 and 4 are not formed to have a two-layer structure together with a band-shaped portion 61 of an N power wiring 6 but may be arranged in parallel with each other as shown in FIG. 6. In this case, it is preferable that the first band-shaped portions 41 and 44 should be formed on an insulating layer (not shown) fixed onto a base plate 20 in the same manner as the N power wiring 6. Even if the first band-shaped portions 41 and 44 are thus provided, it is possible to adequately obtain the effect of reducing an inductance generated on a current path.

[3. Third Embodiment]

Figure 7:
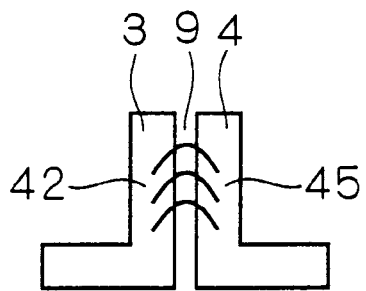
FIG. 7 is a partial plan view showing a power module according to a third embodiment.

In a power module according to a third embodiment, the second band-shaped portions 42 and 45 of the output terminals 3 and 4 belonging to each of the terminal pairs T1 to T3 are electrically connected through a bonding wire 9 as shown in FIG. 7 in the power module 101 according to the first embodiment. Consequently, the power module 101 has a circuit structure shown in FIG. 10 in place of that shown in FIG. 4. Therefore, the power module according to the present embodiment can be used for driving an induction motor, a DC motor or the like. Moreover, the power module 101 for driving an SR motor is used as it is except for the bonding wire 9. Consequently, a manufacturing cost can be reduced.

[4. Fourth Embodiment]

Figure 8:
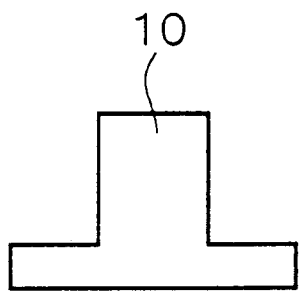
FIG. 8 is a partial plan view showing a power module according to a fourth embodiment.

In a power module according to a fourth embodiment, a set of output terminals 3 and 4 belonging to each of the terminal pairs T1 to T3 are replaced with a single plate-shaped output terminal 10 having a T-shaped planar outline as shown in FIG. 8 in the power module 101 according to the first embodiment. The output terminal 10 is equivalent to the output terminals 3 and 4 including the second band-shaped portions 42 and 45 (FIG. 1) connected integrally with each other to have a T-shaped planar outline.

Figure 10:
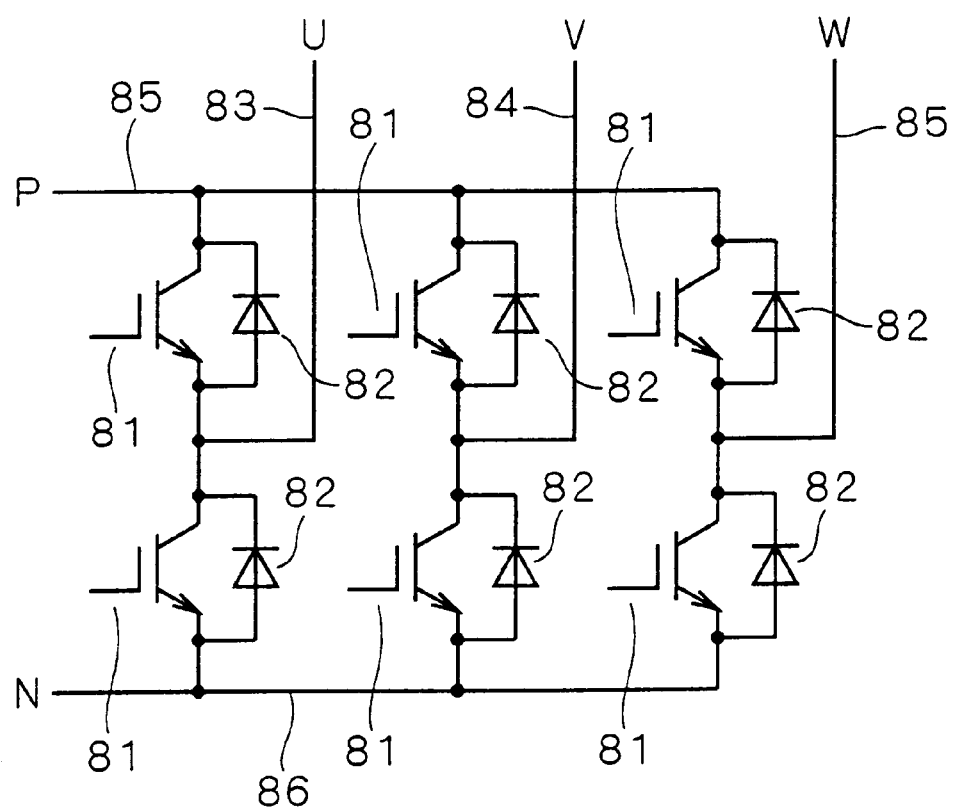
FIG. 10 is a circuit diagram showing a conventional power module.

Since a set of output terminals 3 and 4 are replaced with the output terminal 10, the power module 101 has a circuit structure shown in FIG. 10 in place of that shown in FIG. 4. Therefore, the power module according to the present embodiment can be used for driving an induction motor, a DC motor or the like. Moreover, the power module 101 for driving an SR motor is used as it is except for the output terminal 10.

Consequently, a manufacturing cost can be reduced.

[5. Fifth Embodiment]

Figure 9:
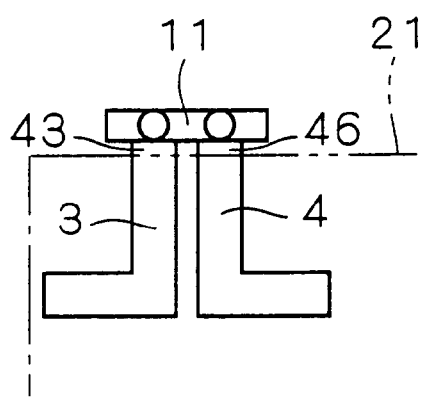
FIG. 9 is a partial plan view showing a power module according to a fifth embodiment.

In a power module according to a fifth embodiment, the protrusions 43 and 46 of the output terminals 3 and 4 belonging to each of the terminal pairs T1 to T3 are connected electrically through a conductive connecting member 11 on the outside of the case 21 as shown in FIG. 9 in the power module 101 according to the first embodiment. For example, one of ends of a plate-shaped conductive member and the other end thereof are fastened to the protrusions 43 and 46 with a screw, respectively. Consequently, the power module 101 has the circuit structure shown in FIG. 10 in place of that shown in FIG. 4.

As a result, the power module according to the present embodiment can be used for driving an induction motor, a DC motor or the like. Moreover, the power module 101 to be used for driving an SR motor is utilized except for the connecting member 11. Therefore, a manufacturing cost can be reduced. Furthermore, the connecting member 11 is used on the outside of the case 21. Thus, a user having the power module 101 can easily carry out remodeling by himself (herself).

[6. Variant]

While the example in which the three circuits C1 to C3 are connected in parallel has been described in the above-mentioned embodiments, it is also possible to constitute a power module in which only two circuits C1 and C2 are connected in parallel for a single phase, for example. In general, the present invention can be carried out in such a configuration that N circuits C1 to CN are connected in parallel between a P power wiring 5 and an N power wiring 6 for an integer N which is equal to or greater than 2.

While the invention has been described in detail, the foregoing description is in all aspects illustrative and not restrictive. It is understood that numerous other modifications and variations can be devised without departing from the scope of the invention.

What is claimed is:

1. A power module comprising:

a substrate;

first and second power wirings provided over said substrate;

first to Nth ($N \geq 2$) terminal pairs provided over said substrate, each pair thereof having first and second output terminals; and first to Nth circuits provided over said substrate, each circuit thereof being connected to said first and second power wirings, said nth circuit including, for all n (n=1 to N):

a first series circuit having a first switching element connected to said first power wiring and a first diode element connected to said second power wiring which are connected in antiseries, a connecting portion thereof being connected to said first output terminal of said nth terminal pair; and a second series circuit having a second diode element connected to said first power wiring and a second switching element connected to said second power wiring which are connected in antiseries, a connecting portion thereof being connected to said second output terminal of said nth terminal pair, wherein said first to Nth circuits are arranged in the following order, all of switching elements connected to said first power wiring and all of diode elements connected to said first power wiring are arranged to form a first line extending without crossing said first power wiring, all of switching elements connected to said second power wiring and all of diode elements connected to said second power wiring are arranged to form a second line extending without crossing said second power wiring, said switching elements and said diode elements are arranged alternately in directions along said first line, along said second line, and along lines crossing said first and second lines, at least a portion of said first output terminal and at least a portion of said second output terminal are arranged between said first line and said second line for each of said first to Nth terminal pairs, and for said all n, said first switching element and said first diode element which belong to said nth circuit are connected through a first bonding wire, a middle portion of said first bonding wire being connected to said at least a portion of said first output terminal belonging to said nth terminal pair, and said second switching element and said second diode element which belong to said nth circuit are connected through a second bonding wire, a middle portion of said second bonding wire being connected to said at least a portion of said second output terminal belonging to said nth terminal pair.

2. The power module according to claim 1, wherein said first power wiring is provided like a band along said first line, and said first switching element and said second diode element which belong to each of said first to Nth circuits are provided on said first power wiring.

3. The power module according to claim 1, further comprising a case for housing said first to Nth circuits provided over said substrate cooperating with said substrate, each of said first and second output terminals of each of said first to Nth terminal pairs having a protrusion which is different from said at least a portion and protruded outward from said case, and all of said protrusions belonging to said first to Nth terminal pairs being provided closer in the same terminal pair than between different terminal pairs.

4. The power module according to claim 3, wherein each of said first and second output terminals belonging to each of said first to Nth terminal pairs has first and second band-shaped portions having one ends crossing at a right angle to take an L-shaped planar outline, said first band-shaped portion being provided in parallel with said first and second lines corresponding to said at least a portion and an end of said second band-shaped portion corresponding to said protrusion, and said second band-shaped portions of said first and second output terminals belonging to each of said first to Nth terminal pairs are arranged in parallel such that both of said first and second output terminals take an almost T-shaped planar outline.

5. The power module according to claim 4, wherein said second band-shaped portions of said first and second output terminals belonging to each of said first to Nth terminal pairs are electrically connected through a bonding wire.

6. The power module according to claim 4, wherein said protrusions of said first and second output terminals belonging to each of said first to Nth terminal pairs are electrically connected through a conductive connecting member.

7. The power module according to claim 4, wherein said second band-shaped portions of said first and second output terminals belonging to each of said first to Nth terminal pairs are connected integrally with each other such that both of said first and second output terminals take a T-shaped planar outline.

8. A power module comprising:

a substrate;

first and second power wirings provided over said substrate;

first to Nth (N≧2) terminal pairs provided over said substrate, each pair thereof having first and second output terminals; and first to Nth circuits provided over said substrate, each circuit thereof being connected to said first and second power wirings, said nth circuit including, for all n (n=1 to N):

a first series circuit having a first switching element connected to said first power wiring and a first diode element connected to said second power wiring which are connected in antiseries, a connecting portion thereof being connected to said first output terminal of said nth terminal pair; and a second series circuit having a second diode element connected to said first power wiring and a second switching element connected to said second power wiring which are connected in antiseries, a connecting portion thereof being connected to said second output terminal of said nth terminal pair, wherein said first to Nth circuits are arranged in the following order, all of switching elements connected to said first power wiring and all of diode elements connected to said first power wiring are arranged to form a first line extending without crossing said first power wiring, all of switching elements connected to said second power wiring and all of diode elements connected to said second power wiring are arranged to form a second line extending without crossing said first second power wiring, said switching elements and said diode elements are arranged alternately in directions along said first line, along said second line, and along lines crossing said first and second lines, at least a portion of said first output terminal and at least a portion of said second output terminal are arranged like a band extended along said first line and said second line therebetween for each of said first to Nth terminal pairs, said second power wiring has a band-shaped portion extended along said first and second lines therebetween, and said band-shaped portion is arranged in parallel with said at least a portion of all of said first and second output terminals.

9. The power module according to claim 8, wherein said second power wiring has N protrusions protruded from said band-shaped portion to enter said second line, each of said N protrusions being provided between said first diode element and said second switching element which belong to the same circuit and being connected to a middle portion of a bonding wire connecting said first diode element and said second switching element.

10. The power module according to claim 8, wherein said first power wiring is provided like a band along said first line, and said first switching element and said second diode element which belong to each of said first to Nth circuits are provided on said first power wiring.

11. The power module according to claim 8, further comprising a case for housing said first to Nth circuits provided over said substrate cooperating with said substrate, each of said first and second output terminals of each of said first to Nth terminal pairs having a protrusion which is different from said at least a portion and protruded outward from said case, and all of said protrusions belonging to said first to Nth terminal pairs being provided closer in the same terminal pair than between different terminal pairs.

12. The power module according to claim 11, wherein each of said first and second output terminals belonging to each of said first to Nth terminal pairs has first and second band-shaped portions having one ends crossing at a right angle to take an L-shaped planar outline, said first band-shaped portion being provided in parallel with said first and second lines corresponding to said at least a portion and an end of said second band-shaped portion corresponding to said protrusion, and said second band-shaped portions of said first and second output terminals belonging to each of said first to Nth terminal pairs are arranged in parallel such that both of said first and second output terminals take an almost T-shaped planar outline.

13. The power module according to claim 12, wherein said second band-shaped portions of said first and second output terminals belonging to each of said first to Nth terminal pairs are electrically connected through a bonding wire.

14. The power module according to claim 12, wherein said protrusions of said first and second output terminals belonging to each of said first to Nth terminal pairs are electrically connected through a conductive connecting member.

15. The power module according to claim 12, wherein said second band-shaped portions of said first and second output terminals belonging to each of said first to Nth terminal pairs are connected integrally with each other such that both of said first and second output terminals take a T-shaped planar outline.

16. A power module comprising:

a substrate;

first and second power wirings provided over said substrate;

first to Nth (N≧2) terminal pairs provided over said substrate, each pair thereof having first and second output terminals; and first to Nth circuits provided over said substrate, each circuit thereof being connected to said first and second power wirings, said nth circuit including, for all n (n=1 to N):

a first series circuit having a first switching element connected to said first power wiring and a first diode element connected to said second power wiring which are connected in antiseries, a connecting portion thereof being connected to said first output terminal of said nth terminal pair; and a second series circuit having a second diode element connected to said first power wiring and a second switching element connected to said second power wiring which are connected in antiseries, a connecting portion thereof being connected to said second output terminal of said nth terminal pair, wherein said first to Nth circuits are arranged in the following order, all of switching elements connected to said first power wiring and all of diode elements connected to said first power wiring are arranged to form a first line extending without crossing said first power wiring, all of switching elements connected to said second power wiring and all of diode elements connected to said second power wiring are arranged to form a second line extending without crossing said second power wiring, said switching elements and said diode elements are arranged alternately in directions along said first line, along said second line, and along lines crossing said first and second lines, at least a portion of said first output terminal and at least a portion of said second output terminal are arranged like a band extended along said first line and said second line therebetween for each of said first to Nth terminal pairs, said second power wiring has a band-shaped portion extended along said first and second lines therebetween, and said band-shaped portion and said at least a portion of all said first and second output terminals are separately provided on one of main surfaces of a band-shaped insulating layer and the other of said main surfaces, and thereby being opposite to each other in parallel with said insulating layer interposed therebetween.

17. The power module according to claim 16, wherein said second power wiring has N protrusions protruded from said band-shaped portion to enter said second line, each of said N protrusions being provided between said first diode element and said second switching element which belong to the same circuit and being connected to a middle portion of a bonding wire connecting said first diode element and said second switching element.

18. The power module according to claim 16, wherein said first power wiring is provided like a band along said first line, and said first switching element and said second diode element which belong to each of said first to Nth circuits are provided on said first power wiring.

19. The power module according to claim 3, further comprising a case for housing said first to Nth circuits provided over said substrate cooperating with said substrate, each of said first and second output terminals of each of said first to Nth terminal pairs having a protrusion which is different from said at least a portion and protruded outward from said case, and all of said protrusions belonging to said first to Nth terminal pairs being provided closer in the same terminal pair than between different terminal pairs.

20. The power module according to claim 19, wherein each of said first and second output terminals belonging to each of said first to Nth terminal pairs has first and second band-shaped portions having one ends crossing at a right angle to take an L-shaped planar outline, said first band-shaped portion being provided in parallel with said first and second lines corresponding to said at least a portion and an end of said second band-shaped portion corresponding to said protrusion, and said second band-shaped portions of said first and second output terminals belonging to each of said first to Nth terminal pairs are arranged in parallel such that both of said first and second output terminals take an almost T-shaped planar outline.

\* \* \* \* \*